United States Patent
Del Gatto et al.

(10) Patent No.: US 7,289,368 B2
(45) Date of Patent: Oct. 30, 2007

(54) CONTROL OF VOLTAGES DURING ERASE AND RE-PROGRAM OPERATIONS OF MEMORY CELLS

(75) Inventors: Nicola Del Gatto, Torre del Greco (IT); Carlo Lisi, Milan (IT); Umberto Di Vincenzo, Capriate S.G. (IT); Paolo Turbanti, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 123 days.

(21) Appl. No.: 11/334,205

(22) Filed: Jan. 18, 2006

(65) Prior Publication Data

US 2006/0171213 A1    Aug. 3, 2006

(30) Foreign Application Priority Data

Jan. 18, 2005    (IT)    ............................ VA2005A0001

(51) Int. Cl.
*G11C 11/34*    (2006.01)
(52) U.S. Cl. ........................... 365/185.26; 365/185.03; 365/185.19; 365/185.2
(58) Field of Classification Search ........... 365/185.03, 365/185.18, 185.19, 185.2, 185.22, 185.26
See application file for complete search history.

(56) References Cited

U.S. PATENT DOCUMENTS 7,180,787 B2 *    2/2007    Hosono et al. .......... 365/185.24

FOREIGN PATENT DOCUMENTS

| EP | 1249841 | 10/2002 |
|---|---|---|
| EP | 1467377 | 10/2004 |

* cited by examiner

*Primary Examiner*—VanThu Nguyen
(74) *Attorney, Agent, or Firm*—Lisa K. Jorgenson; Allen, Dyer, Doppelt, Milbrath & Gilchrist, P.A.

(57) ABSTRACT

A method for verifying an array cell of a memory device may include determining after each erase pulse or program pulse the threshold of a cell addressed through a selected array word-line and bit-line, by applying an identical voltage ramp to the selected array word-line and to the control gate of a reference cell, while biasing at a certain voltage deselected word-lines through distribution lines of the voltage generated by a charge pump generator. The method may further include temporarily decoupling the deselected word-lines from the distribution lines of the bias voltage for the duration of the voltage ramp.

17 Claims, 3 Drawing Sheets

CONTROL OF VOLTAGES DURING ERASE AND RE-PROGRAM OPERATIONS OF MEMORY CELLS

FIELD OF THE INVENTION

This invention relates in general to memory devices, and, in particular, to techniques for controlling erase and reprogram operations of memory cells, as may be useful in multi-level FLASH memory devices and in other types of memory devices.

BACKGROUND OF THE INVENTION

A logic state is stored in a cell by programming its threshold voltage. In nonvolatile memory devices this is done by transferring a certain amount of electrical charge in a floating gate of the cell.

The storage capacity of memory devices, besides by increasing the integration density of arrays of cells individually addressable through word-lines and bit-lines of the array, can be multiplied by storing more than one bit of information in each single cell of the same physical structure as if destined to store a single information bit. Though based on the same physical mechanisms, the operations of programming and reading cells that store more than one bit (multi-level cells) are carried out with techniques that differ from those used with cells storing a single bit (two-level cells).

Memory array cells are read by comparing an electrical parameter correlated with the current that flows through an addressed array cell, with the same electrical parameter correlated with the current that flows through a reference cell that stores known logic value. Basically, to read a two-level memory array cell, a certain voltage is applied to the control gate (word-line) of the cell. The value of this reading voltage is between the threshold voltage of an erased cell and the threshold voltage of a programmed cell such that when the cell is programmed, the reading voltage is lower than its threshold voltage and as a consequence no current flows through the cell. By contrast, when the cell is erased, the reading voltage is higher that its threshold voltage and thus a current flows through the cell.

In multi-level cells, n-bits of information may be stored by making the programming voltages of the different thresholds that may be set for one memory cell define $2^n$ different intervals, each interval being associated to a respective n-bit datum. A reading operation is carried out by comparing an electrical parameter, correlated with the current that flows through the cell, with $2^n$ distinct reference intervals (defined by the $2^{n-1}$ distinct thresholds that may be programmed for single cell), each associated to a respective n-bit datum, and thus determining the logic datum associated to the distinct interval of values in which the electrical parameter is comprised.

This approach for a multi-level operation of the cells is applicable both to volatile memory cells, such as DRAMs, and to nonvolatile memory devices, such as EEPROMs and FLASH-EPROMs. Of course, incrementing the number of information bits that may be stored in a single memory cell makes certain characteristics of cells more critical such as their immunity to disturbances (noise), to the spread of information retention characteristics, and to tolerance ranges of biasing voltages with which each cell is programmed and read.

There is a vast literature about these sophisticated techniques of erasing, programming and reading memory cells (both single-bit cells and multiple-bit cells). In particular, the document EP-A-1,249,841 discloses an asynchronous-serial-dichotomous read amplifier also known as successive approximations amplifier, and the document EP-A-1,467,377 discloses a method for reading nonvolatile memory cells.

A detailed recap of these known methods and circuits for operating memory devices is deemed unnecessary, because these methods and implementing circuits for managing erase, program and read phases of memory cells of devices of different kind are well known to every skilled person in the field of architectures and of methods for managing memory devices.

As it is well known, critical issues and reliability problems may be caused by the unavoidable spread of electrical characteristics present among the single cells of a memory array, though realized with the same sequence of treatments and process steps with which the whole array cells is fabricated and/or by unavoidable differences among the bias conditions of the single cells of the memory array due to inevitable small differences of electrical characteristics of the connection paths from and to addressed cells at different locations in the array.

To address these differences and ensure the required precision, both the erase operation of previously programmed cells as well as their re-program operation are carried out according to appropriate routines for ensuring that information that will eventually be read from the memory be error-free.

During the erase operation, usually carried out in parallel on all memory cells or more often on all the cells of a selected sector of the array, the cells are subject to sequentially applied erase pulses (in the case of nonvolatile cells for nullifying the electrical charge stored in the floating gate), verifying after each pulse that all the cells of the selected sector have a turn on threshold below a certain limit value (EV) of the limit or erase distribution. Generally, the erase operation is carried out through a succession of erase pulses as far as all the cells of the selected sector verify the condition.

The small differences that inevitably exist among the numerous cells of the sector to be erased determine a certain distribution or spread of the erase distribution and also, after having re-programmed the previously erased sector, of the other distributions of programmed cells. By way of example, FIG. 1 shows, four (22) distributions, namely: 11, 10, 01 and 00, of the array cells (or only of a selected sector), in the case of a multi-level FLASH memory with two bits per cell.

Clearly, it is important to control with a suitably refined precision the width of the four distinct distributions, in order for the read amplifiers to have safety margins for discriminating among the various distributions to which a certain cell belongs by comparing its conductance with that of reference cells, the work points of which, R1, R2 and R3, are indicated in the diagram of FIG. 1, such as to ensure a correct reading of the stored information.

Control of the width of the program distributions 10, 01 and 00 (that is of the programmed cells) is carried out when programming (writing) the cells by verifying when their respective limits PV1, PV2 and PV3 are surpassed. Control of the width of the erase distribution 11 is carried out when erasing in parallel all the cells prior to re-programming them.

In the reading phase that is carried out for verifying that all cells have been correctly erased in parallel, some cells will posses characteristics that make them close to the right-hand margin of the distribution, that is thresholds voltages relatively close to a certain limit value EV. These cells of the erase distribution 11 will be even more at risk of false readings because of noise, during the reading steps for verifying a correct erasure of all the cells of a sector (or of the whole array). These cells may unduly switch as if they had a threshold voltage larger than the limit value EV.

During the erase verifications carried out selectively cell-by-cell by addressing it through the respective word-line and bit-line, the other (deselected) word-lines are biased at a voltage sufficient for ensuring that even any depleted cell, that accidentally may still be present on the same address bit-line, is turned off.

The spurious verify fail that may be accidentally caused by one of these "marginal" cells (i.e. close to the right-hand limit value (EV) of the erase distribution 11) determines the continuation of the erase process through the application of a further erase pulse that, being applied in parallel to all the cells of the distribution (non selective operation), will produce a further shift of the threshold voltage of all the cells. This may lead to over-erasing a certain number of cells that will assume an accentuated state of depletion that will need to be recovered during a dedicated so-called "soft program" phase that precedes the re-programming (i.e. generation of the distinct program distributions 10, 01 and 00) of the erased sector (or of the whole array) for bringing all the cells that were excessively depleted beyond the limit value DV of the erase distribution 11.

Differently from the erase operation, both soft program and program (writing) are selective operations carried out cell-by-cell, by addressing each cell through the respective word-line (control gate) and the respective bit-line, and generally they are implemented by applying a sequence of program pulses (small for the soft program and more robust for the successive program operation of the cells of the sector) separated by a verify read operation ("deletion verify" or DV during soft program and "program verify" or PV during program operation) that is carried out by applying an identical voltage ramp to the word line of the addressed cell and to the control gate of a certain reference cell.

In particular, during the soft program phase, it is common practice to apply to the word-lines deselected during the Deletion Verify phase of the single cells, a voltage of sign and value sufficient for ensuring that any depleted cell, that may be present on the bit-line of the addressed cell under verification of its turn-on threshold characteristic, is turned off. In the most common FLASH-EPROM memory devices, the sign of the bias voltage for surely turning off depleted cells is negative (that is a sufficiently "below ground" voltage).

Even during the successive program phase (writing) of the erased cells eventually restored in a fairly identical condition (inside the distribution 11 of FIG. 1) by soft programming, it may be useful to negatively bias word-lines adjacent to the selected one for reducing the possibility of propagating disturbances and thus it may be useful to carry out also the Program Verify after a program pulse, under the same conditions.

The soft program technique for recovering the cells that were excessively depleted without of course getting excessively close to or surpassing the limit EV of the erase distribution 11, contemplates the application of programming pulses to the addressed deplete cell to be recovered starting from very low applied voltages (for example of about 1.8V) that may be gradually increased.

After each program pulse, a verify reading step is carried out, during which to the word-lines of the addressed cell is applied a voltage ramp identical to that applied on the reference cell, while the remaining (deselected) word-lines, are biased at a sufficiently negative voltage for ensuring that any deplete cell, that may be still present in the addressed bit-line, is turned off.

During the soft programming of the cells of a sector of memory cells previously erased, the verify read operation after each soft program pulse is necessary for estimating the position of the addressed cell in respect to the value DV of the respective distribution, as depicted in FIG. 1. If the threshold of the cell is found to be at the left side of the value DV, a further programming pulse is applied to the cell and so-forth as far as the threshold of the cell is brought to the right side of the limit value DV of the distribution.

If, at the end of the soft program operation, certain array cells remain at the left of the limit value DV, reading operations carried out at memory locations connected to bit-lines comprising these depleted cells could be negatively affected because these cells may absorb a significant current even with the relative word-line grounded. Notably, the soft program phase is extremely sensitive and must be adequately controlled for ensuring the correct functioning of the memory.

In the case of a FLASH memory with two-bit cells, the cell distributions of which are represented in FIG. 1, the width of the central distribution 00, 01, 10, is adjusted during the program phase (writing) of the cells, while the width of the erase distribution 11 is adjusted during the erase phase.

FIG. 2 depicts a typical architecture of an array sector wherein the word-lines of the memory cells (WL-POLY) in contact with the strip M2 defined in metal 2 are highlighted. As it may be observed, the word-lines WL cross the local bit-lines BL M1 and the global bit-lines BL M3, respectively defined in metal 1 and in metal 3.

FIG. 3 shows schematically a section of the architecture of FIG. 2, in the zone indicated by the dot and dash line perimeter. The coupling capacitances between the deselected word-lines, biased at a negative voltage VNEG, and the selected WL to which the voltage ramp Ramp is applied for carrying out the verify reading operation. In case of a common FLASH-EPROM memory device, the total coupling capacitance may be on the order of several hundreds of fF (the capacitance of each WL towards ground is on the order of several pF).

Commonly, the negative voltage VNEG with which the deselected word-lines are biased, is generated by a charge pump generator normally having a non-negligible ripple, generally of about 200 mV peak amplitude. The generated negative voltage VNEG is regulated at a certain design value, for instance at about −3V and, because of the periodicity of the phases of the charge pump, that are necessary for sustaining the desired output voltage level, during ripple recovery phase there may be ramps of about 20 mV/ns. By contrast, the reference cell array comprises generally a single active word-line while the adjacent word-lines are constantly grounded during any read operation.

It has been observed that, because of the coupling capacitances, symbolically highlighted in FIG. 3, the ripple present on the negative voltage VNEG causes a distortion of the voltage ramp that is applied to the word-line of the addressed array cell WL_MAT, that on the contrary is not present on the voltage ramp that is applied to the word-line WL_RE of the reference cells. This situation is graphically shown in FIG. 4.

It has also been observed that disturbances that corrupt the voltage ramp applied to the WL-MAT in a verify read phase cause a time shift of the switching of the reading amplifier that may be estimated in about 1 ns.

In such a situation, during soft programming, cells that should really switch before the voltage ramp attains the limit value DV (that is any depleted cell that may be present), often switch after the limit value DV is surpassed. This occurrence causes their soft program to end unduly before having been fully recovered by bringing their threshold to the right of the limit value DV of the respective distribution.

As a consequence, at the end of the soft program phase of the erased sector there could still be cells at the left of the limit value DV of the respective distribution 11, as schematically highlighted by the circled zone on the diagram of FIG. 5. The presence of cells that are even slightly depleted may be highly disturbing because they absorb a current even when the respective word-line is grounded (WL=0), compromising the correctness of a reading operation of information stored in other cells connected to the same bit-line.

Even during the preceding erase operation of all the cells of the sector, during a delete verify phase, certain cells close to the limit value EV of the erase distribution 11, because of the ripple present on the voltage VNEG, could be improperly recognized as being still outside the limit value EV and thus they could command further erase pulses. As a consequence, other cells of the sector subjected to a further erase pulse could be made depleted (that is could be brought to the left of the limit value DV) thus unnecessarily burdening the successive soft program phase.

SUMMARY OF THE INVENTION

An effective approach to the shortcomings has now been found. Essentially, the method overcomes the above discussed problems by carrying out, during a verify read phase of a cell, a temporary de-coupling of the deselected word-lines from the distribution lines of the bias voltage, for the whole duration of the voltage ramp that is applied to the control gate of the addressed array cell and to the control gate of a reference cell.

The de-coupling may be carried out locally either by placing in high impedance state the line that supplies the bias voltage to the respective drivers of the deselected word-lines or by commanding momentarily stopping of the charge pump of the generator of the bias voltage and isolating the voltage divider that normally provides a measure of the bias voltage output by the generator of a feedback regulation loop of the generated bias voltage.

BRIEF DESCRIPTION OF THE DRAWINGS

The invention will be described referring to the attached drawings, wherein.

DETAILED DESCRIPTION OF THE DRAWINGS

It has been found that the above discussed problems induced by the effects of disturbances, such as those represented by the ripple present on the bias voltage of deselected word-lines during verify read operations on single array cell to ascertain the depletion state during parallel erasing of all the memory cells of an array or of a sector, the recovery state of possibly depleted cells during the execution of the soft program of single cells following the erase process or of the programming state during the writing of data, are practically eliminated by temporarily decoupling deselected word-lines from the distribution network of the bias voltage for the duration of the voltage ramp applied to the selected word-line for single cell verification and to a word-line of reference cells.

Figure 1:
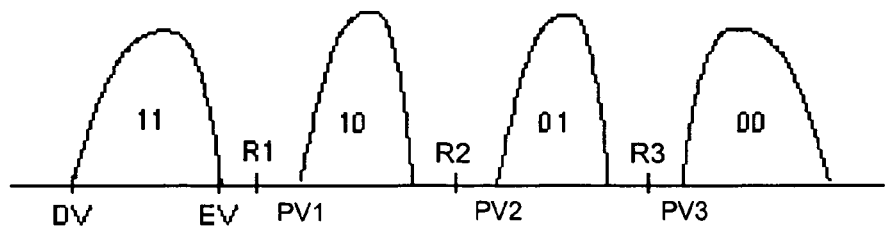
FIG. 1, as discussed above, shows the four distinct distributions of the array cells of a two-bits/cell multi-level FLASH memory as in the prior art.
Figure 2:
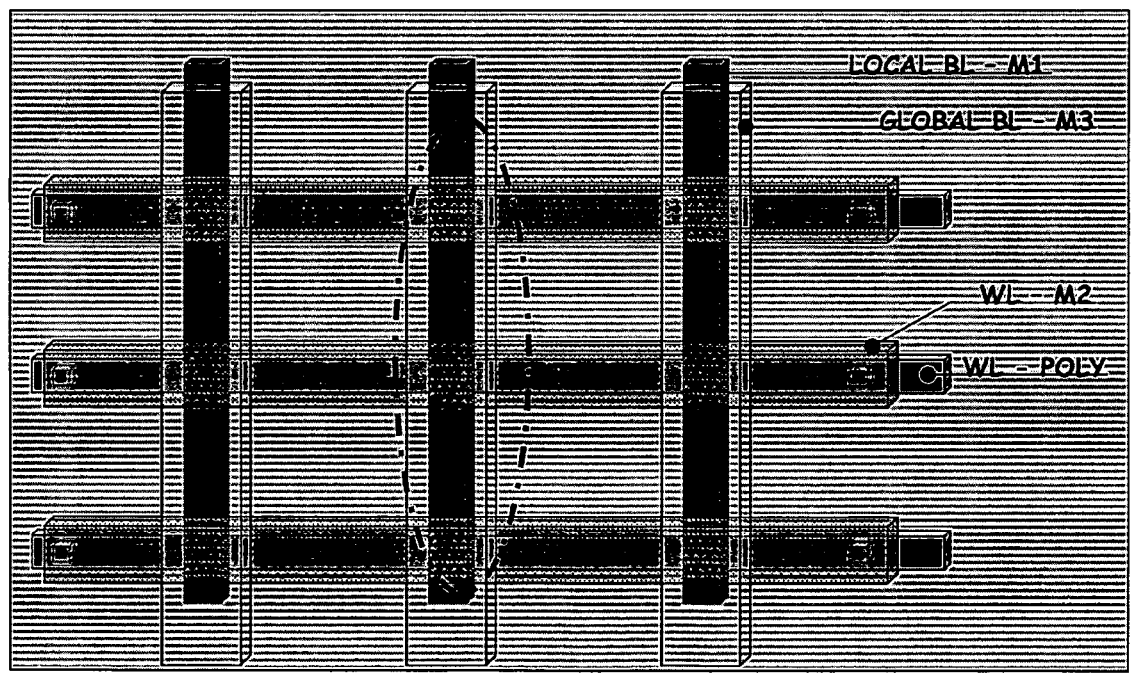
FIG. 2 is a layout scheme of the structure of a memory sector of a multilevel memory array as in the prior art.
Figure 3:
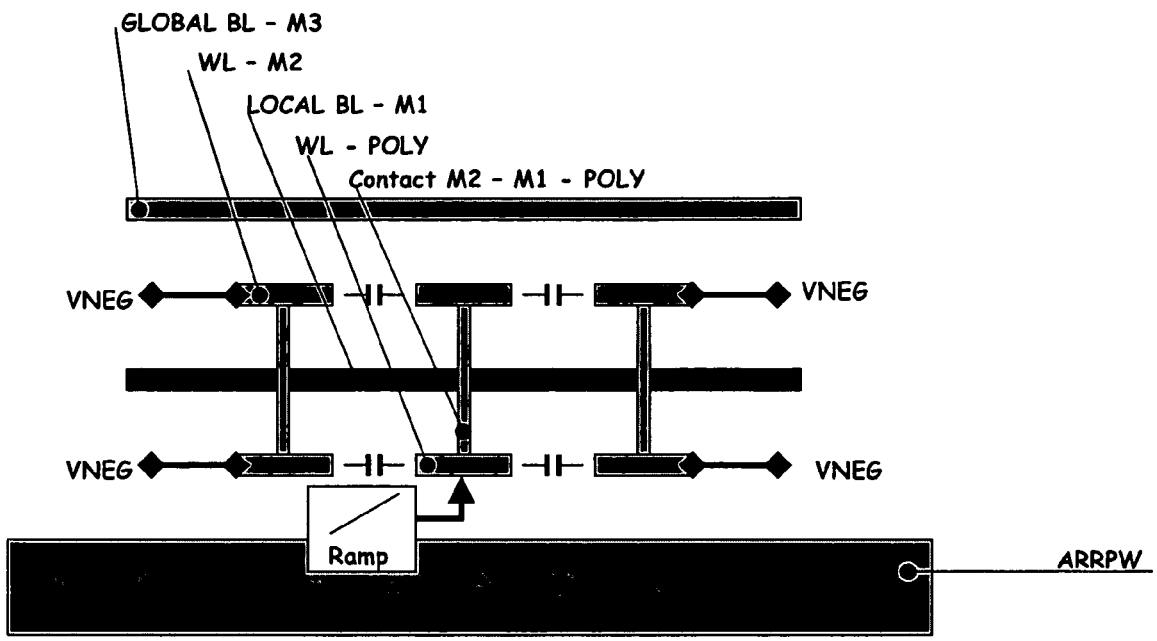
FIG. 3 illustrates electrical details of the structure of FIG. 2.
Figure 4:
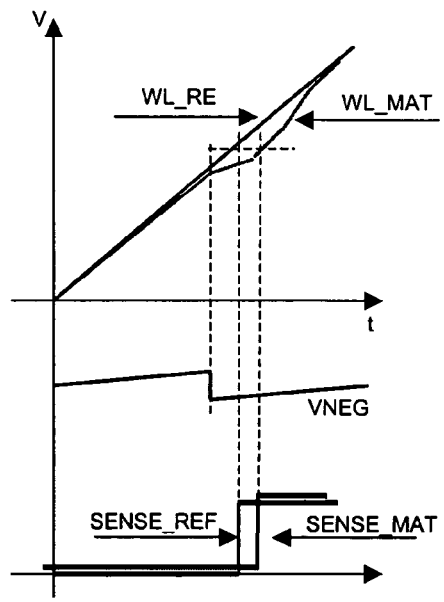
FIG. 4 shows the effects of ripple present on the biasing voltage of deselected word-lines as in the prior art.
Figure 5:
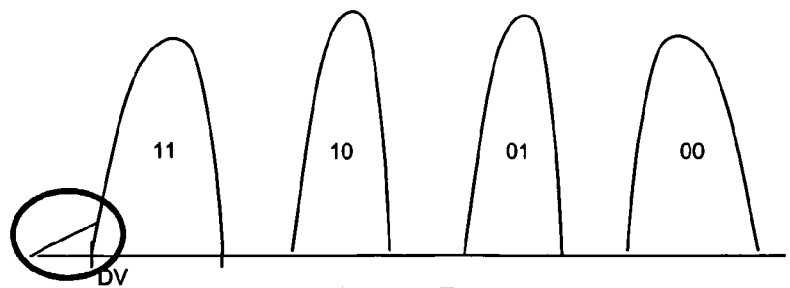
FIG. 5 graphically shows possible results of the ripple on the various cell distributions as in the prior art.
Figure 6:
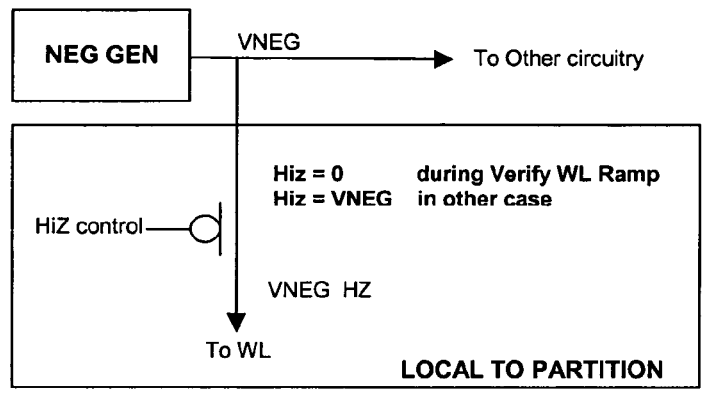
FIG. 6 schematically depicts a first embodiment of this invention that addresses the problems determined by the ripple present on the bias voltage of deselected word-lines.

According to a first embodiment depicted in FIG. 6, such a decoupling is controlled by an appropriate signal HiZ that controls a PMOS switch for locally placing in a high impedance state (i.e. temporarily isolating) the connection line VNEG_HZ of the drivers of the deselected word-lines of the sector of the memory array to the distribution network of the negative voltage VNEG generated by the respective generator NEG GEN.

Figure 7:
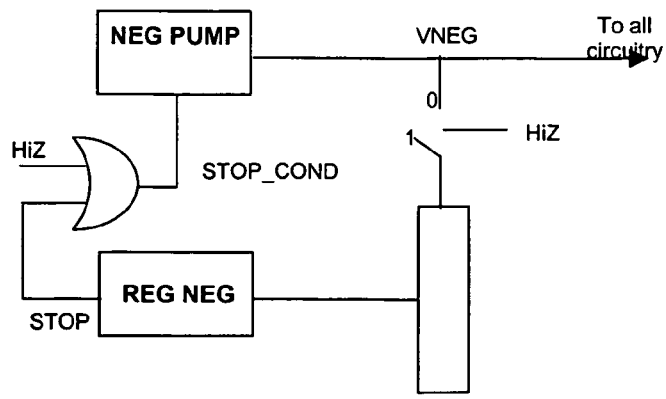
FIG. 7 schematically depicts an alternative embodiment of the invention.

According to the alternative embodiment depicted in FIG. 7, the same signal HiZ is used for temporarily stopping the charge pump NEG PUMP of the generator, forcing it to be stopped through the signal STOP_COND, and at the same time for isolating, from the distribution network of the voltage VNEG, the voltage divider that provides to the regulator REG NEG a measure of the voltage VNEG output by the generator.

According to this preferred embodiment, the distribution network of the negative voltage VNEG does not undergo any relevant perturbation during the erase verify operation and remains well anchored to its voltage level because of the non-negligible capacitance of the whole distribution network.

That which is claimed is:

1. A method for verifying an array cell of a memory device comprising:
    determining after an erase pulse or a program pulse a threshold of an array cell addressed through a selected word-line and a selected bit-line by applying an identical voltage ramp to the selected word-line and to a control gate of a reference cell while biasing at a bias voltage deselected word-lines through distribution lines of a voltage generated by a charge pump generator; and
    temporarily decoupling the deselected word-lines from the distribution lines of the bias voltage for the duration of the voltage ramp.

2. The method of claim 1 wherein determining follows a applying a soft program pulse for recovering the array cell from a depleted condition and the bias voltage of deselected word-lines is of a sign and value sufficient to ensure turn off of any cell still depleted and that is coupled to the selected bit-line.

3. The method of claim 1 wherein the temporary decoupling is made by placing in a high impedance state the distribution line of the bias voltage to respective drivers of the deselected word-lines.

4. The method of claim 1 wherein the temporary decoupling is made by commanding stopping of the charge pump generator and by isolating a voltage divider that provides an estimation of a voltage output by said charge pump generator for a regulation loop thereof.

5. The method of claim 1 wherein the memory device comprises a multi-level two-bits/cell FLASH-EPROM device.

6. A method for verifying an array cell of a memory device comprising:
   determining after an erase pulse or program pulse a threshold of an array cell addressed through a selected word-line and a selected bit-line by applying a corresponding voltage ramp to the selected word-line and to a control gate of a reference cell while biasing deselected word-lines through distribution lines; and
   temporarily decoupling the deselected word-lines from the distribution lines during the voltage ramp.

7. The method of claim 6 wherein determining follows a applying a soft program pulse for recovering the array cell from a depleted condition and a bias voltage of deselected word-lines is of a sign and value sufficient to ensure turn off of any cell still depleted and that is coupled to the selected bit-line.

8. The method of claim 6 wherein the temporary decoupling is made by placing in a high impedance state the distribution line to respective drivers of the deselected word-lines.

9. The method of claim 6 wherein the temporary decoupling is made by commanding stopping of a charge pump generator supplying a bias voltage to the distribution line of the deselected word-lines.

10. The method of claim 9 wherein the temporary decoupling further comprises isolating a voltage divider that provides an estimation of a voltage output by the charge pump generator for a regulation loop thereof.

11. The method of claim 6 wherein the memory device comprises a multi-level two-bits/cell FLASH-EPROM device.

12. A memory device comprising:
   an array of cells;
   word-lines and bit-lines coupled to said cells;
   distribution lines coupled to said word-lines;
   a reference cell having a control gate; and
   a control circuit for verifying a cell by determining after an erase pulse or program pulse a threshold of the cell addressed through a selected word-line and a selected bit-line by applying a corresponding voltage ramp to the selected word-line and to the control gate of the reference cell while biasing deselected word-lines through distribution lines, and temporarily decoupling the deselected array word-lines from the distribution lines during the voltage ramp.

13. The memory device of claim 12 wherein said control circuit applies a soft program pulse for recovering the cell from a depleted condition and a bias voltage of deselected array word-lines is of a sign and value sufficient to ensure turn off of any cell still depleted and that is coupled to the selected bit-line.

14. The memory device of claim 12 further comprising respective drivers for the word-lines; and wherein said control circuit makes the temporary decoupling by placing in a high impedance state the distribution line to respective drivers of the deselected word-lines.

15. The memory device of claim 12 further comprising a charge pump generator for supplying a bias voltage to the distribution line of the deselected word-lines; and wherein said control circuit makes the temporary decoupling by commanding stopping of said charge pump generator supplying the bias voltage to the distribution line of the deselected word-lines.

16. The memory device of claim 15 wherein said charge pump generator further comprises a voltage divider providing an estimation of a voltage output by said charge pump generator as part of a regulation loop; and wherein said control circuit further makes the temporary decoupling by isolating said voltage divider.

17. The memory device of claim 12 wherein said cells comprise multi-level two-bits/cells of a FLASH-EPROM type.

* * * * *

UNITED STATES PATENT AND TRADEMARK OFFICE
CERTIFICATE OF CORRECTION

PATENT NO. : 7,289,368 B2  Page 1 of 1
APPLICATION NO. : 11/334205
DATED : October 30, 2007
INVENTOR(S) : Del Gatto et al.

It is certified that error appears in the above-identified patent and that said Letters Patent is hereby corrected as shown below:

| | |
|---|---|
| Column 2, Line 11 | Delete: "kind"<br>Insert: -- kinds -- |
| Column 2, Line 18 | Delete: "array cells"<br>Insert: -- array of cells -- |
| Column 2, Line 67 | Delete: "thresholds"<br>Insert: -- threshold -- |
| Column 6, Line 4 | Delete: "DRAWINGS"<br>Insert: -- PREFERRED EMBODIMENTS -- |
| Column 6, Line 55 | Delete: "follows a"<br>Insert: -- follows -- |
| Column 7, Line 16 | Delete: "follows a"<br>Insert: -- follows -- |

Signed and Sealed this

Third Day of March, 2009

JOHN DOLL
*Acting Director of the United States Patent and Trademark Office*